(12) United States Patent
Hermans (10) Patent No.: US 11,935,764 B2
(45) Date of Patent: Mar. 19, 2024

(54) SAWING DEVICE AND METHOD FOR FORMING SAW-CUTS INTO A SEMICONDUCTOR PRODUCT

(71) Applicant: Besi Netherlands B.V., Duiven (NL)

(72) Inventor: Mark Hermans, Geldermalsen (NL)

(73) Assignee: Besi Netherlands B.V., Duiven (NL)

( * ) Notice: Subject to any disclaimer, the term of this patent is extended or adjusted under 35 U.S.C. 154(b) by 401 days.

(21) Appl. No.: 17/415,944

(22) PCT Filed: Feb. 16, 2021

(86) PCT No.: PCT/NL2021/050100
§ 371 (c)(1),
(2) Date: Jun. 18, 2021

(87) PCT Pub. No.: WO2021/167450
PCT Pub. Date: Aug. 26, 2021

(65) Prior Publication Data
US 2022/0319879 A1  Oct. 6, 2022

(30) Foreign Application Priority Data

Feb. 21, 2020 (NL) ..................................... 2024961

(51) Int. Cl.
*H01L 21/67* (2006.01)
*H01L 21/68* (2006.01)
*H01L 21/78* (2006.01)

(52) U.S. Cl.
CPC ........ *H01L 21/67092* (2013.01); *H01L 21/68* (2013.01); *H01L 21/78* (2013.01)

(58) Field of Classification Search
CPC .... H01L 21/67092; H01L 21/68; H01L 21/78
See application file for complete search history.

(56) References Cited

U.S. PATENT DOCUMENTS

| 2003/0073382 A1* | 4/2003 | Manor | ................. | B28D 5/0058 |
| | | | | 451/6 |
| 2004/0112360 A1* | 6/2004 | Boucher | ............. | B23D 59/002 |
| | | | | 125/16.01 |

(Continued)

FOREIGN PATENT DOCUMENTS

| CN | 102744796 A | 10/2012 |
| CN | 202952396 U | 5/2013 |

(Continued)

*Primary Examiner* — Shaun M Campbell
(74) *Attorney, Agent, or Firm* — The Webb Law Firm (57) ABSTRACT

The invention relates to a sawing device for forming saw-cuts into a semiconductor product, including: a carrier for holding the semiconductor product, a saw blade, a first position sensor for determining the position of the semiconductor product held by the carrier, a second position sensor for determining the position of the saw blade, and a control unit configured for controlling the relative movement of the saw blade and the carrier, wherein the sawing device further includes a reference for linking the position of the first position sensor to the position of the second position sensor, wherein the control unit is configured to process, with aid of the reference, the positions determined by the reference sensors into a position of the point on the free surface of the semiconductor product relative to the point on the cutting edge of the saw blade, and, based on this positional information, control the relative movement of the saw blade and the carrier. The invention further relates to a method for forming saw-cuts into a semiconductor product.

18 Claims, 2 Drawing Sheets

(56) References Cited

U.S. PATENT DOCUMENTS

| | | | | |
|---|---|---|---|---|
| 2010/0269650 A1* | 10/2010 | Hojo | ................... | B28D 5/0064 |
| | | | | 83/13 |
| 2012/0240915 A1 | 9/2012 | Huber et al. | | |
| 2019/0134837 A1* | 5/2019 | Sakurai | ................. | B23Q 1/621 |
| 2020/0227379 A1* | 7/2020 | Huang | ................... | H01L 24/75 |

FOREIGN PATENT DOCUMENTS

| | | | |
|---|---|---|---|
| CN | 103752944 A | 4/2014 |
| CN | 102689368 B | 1/2015 |
| JP | 2001297999 A | 10/2001 |
| JP | 2003168655 A | 6/2003 |
| JP | 3162580 U | 9/2010 |
| JP | 2015199142 A | 11/2015 |
| WO | 2009081746 A1 | 7/2009 |
| WO | 2014167392 A1 | 10/2014 |

* cited by examiner

SAWING DEVICE AND METHOD FOR FORMING SAW-CUTS INTO A SEMICONDUCTOR PRODUCT

CROSS-REFERENCE TO RELATED APPLICATIONS

This application is the United States national phase of International Application No. PCT/NL2021/050100 filed Feb. 16, 2021, and claims priority to The Netherlands Patent Application No. 2024961 filed Feb. 21, 2020, the disclosures of which are hereby incorporated by reference in their entirety.

BACKGROUND OF THE INVENTION

Field of the Invention

The present invention relates to a sawing device for forming saw-cuts into a semiconductor product. The invention also relates to a method for forming saw-cuts into a semiconductor product.

Description of Related Art

In the final stages of semiconductor product fabrication, the assembled dies are singulated (diced) to obtain individual integrated circuit (IC) packages. Singulation hereby may take place through machining the carrier interconnecting the individual dies with a rotating saw blade, wherein the carrier is commonly formed by a wafer, a lead frame or a board. As part of the machining operation, any packaging material (often an epoxy resin) encapsulating the dies may in a common instance concurrently be separated. In order to minimize the magnitude of the shear forces in the semiconductor product during the sawing operation, it is beneficial to maximize the sawing depth and thereby let the saw blade overshoot the thickness of the IC package as far as there is space available to allow the saw blade to move into behind the semiconductor product. The dimensions of this space are hereby commonly determined by the jig or carrier holding the semiconductor product during the singulation process. It is thus important that the sawing depth can be controlled with great accuracy to on the one hand maximize the sawing depth while on the other hand prevent the saw blade to saw into the jig or other parts of the sawing device.

Alternatively, the saw blade displacement relative to the IC package may be restricted to the thickness of the lead frame and, if present, the packaging material. This limited saw depth is beneficial if singulation of the individual IC packages is desirable while an underlying carrier such as a foil material layer must remain intact to retain the layout of the separated IC packages for further processing. After all, the IC packages remain connected through the foil material layer in this case. As one could understand, meticulous control of the sawing depth is in this case important to prevent cutting into the foil material layer while completely separating the thereto connected IC packages.

In yet another scenario, the machining of the carrier with the saw may (at first instance) be limited to a partial sawing operation wherein the sawing depth is smaller than the thickness of the carrier, thus leading to a groove being formed into the carrier. No separation of individual IC packages takes place in this case (or at least, not initially). The latter described sawing operation sees application in the fabrication of high-reliability IC packages (in particular quad-flat no leads packages) that need solder-wettable flanks to create robust solder joints wherein a solder fillet adheres to the outer edge of the IC package. After the partial sawing operation, the hereby formed grooves are plated with a solderable surface finish. In a following sawing operation, the IC packages are singulated along a line of singulation adjacent to the groove, creating a step feature in the singulation edge that is easily solder-wettable. This ensures proper solder wetting and thus the formation of highly reliable solder joints during later solder attachment of the IC package to a printed circuit board. In order to create grooves having a certain depth with great precision, accurate control of the sawing depth is of great importance in this application as well.

The Japanese patent JP 2003 168655 discloses a dicing apparatus for grooving or cutting a workpiece such as a semiconductor or electronic component. The dicing apparatus has a laser gauge to measure the upper position of the workpiece, which laser gauge is also able to measure the groove shape that is formed in the upper surface of the workpiece. Furthermore it is also disclosed that the distance between to lower end of a cutting blade and the upper surface of the workpiece may be calculated by using a camera.

SUMMARY OF THE INVENTION

The above-described scenarios are some of the possible applications that illustrate the importance of accurate control of the sawing depth in the fabrication of semiconductor products. A goal of the present invention is thereto to improve the accuracy at which saw-cuts are formed into a semiconductor product. More in particular, the present invention aims to improve on the accuracy at which the saw depth can be controlled.

The invention hereto provides a sawing device for forming saw-cuts into a semiconductor product. Within the scope of the present invention, the free surface of the semiconductor product is the surface of the semiconductor product in which the at least one controlled cut is made during the relative movement of the saw blade and the carrier. Said cut(s) may completely separate the semiconductor product into a number of IC packages, but may also form (shallow) groves in the free surface extending only along a part of the height of the semiconductor product, measured in a direction perpendicular to the free surface. Alternatively, the cut(s) may separate the semiconductor product but leave an underlying foil material layer intact.

The sawing device according to the invention employs two position sensors: one for determining the position of the free surface of the semiconductor product and one for determining the position of the saw blade, and in particular the cutting edge thereof. By actually measuring the position of the free surface of the semiconductor product (or at least a point thereon) and the cutting edge of the saw blade (or at least a point thereon), the least amount of inference is necessary to determine their relative positions, thus minimizing the positional error while relatively moving the carrier with the thereto attached semiconductor product and the saw blade. For example, unevenness of the cutting edge due to wear of the saw blade or height differences in the free surface due to warpage of the semiconductor product can be corrected for due to these measurements. This will enable the sawing device to make a saw-cut with a predetermined depth with high accuracy. The depth of the saw-cut is herein defined as the direction perpendicular to the free surface of the semiconductor product.

By using two position sensors, it becomes easy to observe the cutting edge of the saw blade at the point where the cutting edge contacts the free surface of the semiconductor product together with observing the free surface of the semiconductor product. Namely, as the free surface of the semiconductor product opposes the position on the cutting edge at which the saw blade cuts into said free surface, the use of a single position sensor that relies on a clear line-of-sight between itself and the object to be measured poses practical difficulties. Commonly, a circular saw is used, such that inspection of the cutting edge of the saw blade could in theory also be performed on a side of the saw blade facing away from the free surface of the semiconductor product. However, inspecting the saw blade directly at the actual position of contact eliminates positional errors related to for example the suspension of the saw blade.

The position sensors measure the position of an object relative to themselves. To accurately control the relative movement of the saw blade and the carrier (and thus the thereto connected semiconductor product), necessary for making accurate saw-cuts, the position of the cutting edge of the saw blade and the free surface of the semiconductor product must however be determined relative to each other instead of relative to the position sensors. Namely, this factors out any error in the position of the position sensors. The present invention thereto proposes the use of a reference through which the position of the first position sensor can be linked to the position of the second position sensor. This reference takes the form of a physical object having known dimensions and a position relative to the first and second position sensors that is either fixed and known or obtained through observation by the first and second positions sensors. The control unit is configured to translate the dimensions and the position of the reference relative to the position sensors into a position of the first and second position sensors relative to each other. Together with the positions of the cutting edge of the saw blade and the free surface of semiconductor product determined by the first position sensor and the second position sensor, the control unit is then able to determine the position of a point on the free surface of the semiconductor product relative to a point on the cutting edge of the saw blade. This positional information is then used for controlling the relative movement of the saw blade and the carrier with high accuracy. Note that position of (the free surface of the) the semiconductor product, and thus also the moment thereof relative to the saw blade, is directly linked to the position of the carrier. Namely, the carrier, also commonly named a jig or a chuck, is configured to grip and hold onto the semiconductor product, for example by suction means, such that the position of the semiconductor product is fixated with respect to the carrier. Control of the relative movement of the saw blade and the carrier thus implies steering of the saw blade with respect to the semiconductor product, determining the position, and in particular the depth of the saw cuts.

The reference is formed by at least one reference surface on the carrier observable by the first position sensor and/or the second position sensor, wherein the first position sensor and the second position sensor are configured for determining the position of a point on at least one of the at least one reference surface. The position of the reference surface, or at least a point thereon, may thus be determined by first position sensor and the second position sensor, in which case said reference surface is observable by both the first and second position sensor, which can then individually determine the position of said reference surface with respect to themselves. Alternatively, the reference may comprise multiple reference surfaces on the carrier, at least one of which is observable by the first position sensor and at least another of which is observable by the second position sensor. The relative orientation and position of the multiple reference surfaces should in the latter case be known, which is the case when they form part of the same object. It is key that the at least one reference surface forms part of the carrier, which forms the centre of the method, has given fixed dimensions and does not change its position during the determination of its position relative to the position sensors.

As the reference is formed by a reference surface on the carrier, said reference surface does not necessarily have to form part of the functional part of the carrier acting as a mounting surface of the semiconductor product. In a particular embodiment, the carrier may comprise a reference element protruding past the holding surface, which reference element comprises the at least one reference surface. By using a dedicated reference element, the position of the reference element may be chosen to be easily observable by both the first position sensor as well as the second position sensor. By letting the reference element protrude past the holding surface, the semiconductor product held by the carrier does not block the line of sight between the reference surface and the position sensor observing said reference surface.

More in particular, the reference may comprise a first reference surface observable by the first position sensor and a second reference surface observable by the second position sensor, wherein the first position sensor is configured for determining the position of a point on the first reference surface of the reference and the second position sensor is configured for determining the position of a point on the second reference surface of the reference. Given that the relative orientation and position of the first reference surface and second reference surface are known, the positions of the first position sensor and second position sensor can be linked to each other, i.e. the position of said sensors can be expressed in a position relative to the other sensor. An example of a reference comprising such a first reference surface and second reference surface is a plate-like element with a given, known thickness, having a first surface facing the first position sensor and a second surface facing the second position sensor. Said plate-like element may be connected to the carrier.

An additional reference may be formed by a frame connecting the first position sensor to the second position sensor, wherein the distance spanned by the frame between the first position sensor and the second position sensor is known and fixed. In this case, the position of the first position sensor relative to the second position sensor (and vice versa) can also be determined because the dimensions of the frame connecting the position sensors are known.

The first position sensor and the carrier may be moveable relative to each other. This may enable or simplify mapping the free surface of the semiconductor product with a single position sensor. Connecting thereto, the first position sensor may configured for determining the position of a plurality of points on the free surface of the semiconductor product. The control unit may on turn be configured to process the position of the plurality of points on the free surface of the semiconductor product into a height profile of said free surface, wherein the control unit is adapted to compensate for said height profile in the control of the relative movement of the saw blade and the carrier. This enables the formation of saw-cuts with a constant depth, defined as the distance from the free surface in a direction perpendicular to said free surface, also if (the free surface of) the semiconductor product is not flat due to e.g. warpage. Given the stringent requirements on the dimensional consistency of the final IC packages, it is important that any warpage of the semiconductor product can be corrected for in the formation of the saw-cuts. This is especially the case for applications of the sawing device wherein the semiconductor product undergoes only a partial sawing operation. A partial sawing operation is herewith defined as an operation wherein the sawing depth is smaller than the thickness of the semiconductor product, including any foil material layers. A partial sawing operation results in a semiconductor product that comprises partial cuts, or grooves in the surface of the semiconductor product. This may include the situation wherein the semiconductor product may be fully singulated into separate IC packages, but wherein an underlying foil material layer remains intact to retain the mutual orientation of said separated IC packages. In the latter instance, the sawing depth must be exactly the same as the local thickness of the semiconductor product excluding the foil material layer.

The second position sensor and the saw blade may also be moveable relative to each other. If the saw blade is of the rotary type, the second position sensor and the saw blade are already moveable relative to each other, wherein the position sensor is able to observe the entire cutting edge of the saw blade. The second position sensor may hereby have a fixed position with respect to the sawing device. It may also be possible that instead of or together with the saw blade, the second position sensor is moveable with respect to the sawing device. The latter case may be beneficial in reducing the movement of the saw blade in the position determination of the cutting edge, which could lead to time gains in the sawing operation, as well as a reduction in the wear and tear on the sawing device. The second position sensor is commonly configured for determining the position of a plurality of points on the cutting edge of the saw blade. This enables the position sensor in co-operation with the control unit to determine the height profile of the cutting edge, which changes under the wear of the saw blade. The second position sensor and the saw blade are preferably mutually positioned such that the cutting edge is observable by the position sensor directly at the position with respect to the suspension of the saw blade where the cutting edge contacts the free surface of the semiconductor product. For example, when the free surface of the semiconductor is oriented downwards, the second position sensor is configured to observe the upmost position along the cutting edge of the saw blade.

In a possible embodiment of the sawing device according to the invention, at least one of the first position sensor and second position sensor is a distance sensor. Said distance sensor is adapted to measure the distance between itself and a given point it is set to observe. The distance sensor may herewith determine a one-dimensional position of said point relative to itself. Control of relative movement of the saw blade and the carrier based on the positions determined by the distance sensors is hereby performed with respect to this dimension. Determination of the distance between the cutting edge of the saw blade and the free surface of the semiconductor product based on the respective measurements of the distances between the first position sensor and the free surface, and the second position sensor and the cutting edge, thus allows for control of the depth up to where the saw blade penetrates the free surface. In a preferred embodiment, the distance sensor is a confocal sensor. The distance sensor may alternatively be formed by a triangulation sensor.

The information gathered with the sawing device according to the present invention may be useful for quality control and/or gathering statistical information.

The present invention further relates to a method for forming saw-cuts into a semiconductor product. In the processing step, the knowledge about the positions of the first position sensor and second position sensor relative to each other, obtained through the reference on the carrier, is used to translate the positions of (the points on) the free surface and the cutting edge relative to the respective positions sensors into the positions of (the points on) the free surface and the cutting edge relative to each other. This high accurate positional information allows for controlling of the relative movement of the saw blade and the carrier with high precision, leading to accurate saw-cuts into the semiconductor product. The carrier is used as the centre of reference for the position determination of the first position sensor and the second position sensor, what substantially enhances the accuracy of the saw-cut forming.

The position of the reference may be determined by the first position sensor and the second position sensor. For this to work, the reference should be observable by the first position sensor and the second position sensor. As is already explained in the context of the sawing device, the reference may be formed by a part of the sawing device which may or may not be a dedicated reference element, having one or more reference surfaces observable by the position sensors.

The first position sensor may determine the position of a plurality of points on the free surface of the semiconductor product. The plurality of points on the free surface of the semiconductor product may hereby be processed into a height profile of said free surface, for which height profile is compensated for in the movement the saw-blade relative to the carrier. This compensation may have the effect that the height profile of the free surface of the semiconductor product is followed by the cutting edge of the saw blade to obtain a saw-cut with a (more) uniform depth over the saw cut's entire length along the free surface of the semiconductor product, wherein the depth of the saw-cut is again defined as the distance from the free surface in a direction perpendicular to said free surface.

The height profile of the free surface of the semiconductor product may be followed by the cutting edge of the saw blade in a stepwise fashion. This stepwise following of the free surface of the semiconductor product may be attained by adjusting the sawing depth, and thus the distance over which the saw blade penetrates the semiconductor product, for a certain number of times over the length of the saw-cut. The smaller the adjustment interval, the better the saw blade is able to follow the height profile of the free surface semiconductor product, and the smaller the differences will be in the depth of the saw-cut. As the sawing depth is adjusted based on the relative positions of the saw blade and the semiconductor product, determined by the position sensors, the number of adjustments typically does not exceed the measurement resolution, being the number of points on the free surface of the semiconductor product for which the position is determined by the first position sensor.

The height profile of the free surface of the semiconductor product may alternatively be followed by the cutting edge of the saw blade in a continuous fashion. In this instance, the saw blade is moved along a straight line during the formation of (part of) the saw-cut. As a result, the saw-cut will have a gradual progression that will not be able follow local height differences in the free surface as much as it is able to follow a global height gradient which is commonly seen as a result of warpage of the semiconductor product. The trajectory followed by the saw blade is commonly determined by drawing a straight line between two points on the free surface of the semiconductor product and cutting into the free surface at a constant cutting depth with respect to said straight line.

The position of a point on the cutting edge of the saw blade may be determined before the formation of every consecutive saw-cut. During each sawing operation, the saw blade will abrade. To factor in this abrasion in the formation of the subsequent saw-cuts, it is necessary to measure the position of the cutting edge before the start of the following sawing operation. In practice, the position of multiple points along the entire cutting edge of the saw blade are determined, such that the wear of the entire cutting edge can be mapped and corrected for in the relative movement of the saw blade and the carrier and thus the formation of the saw-cuts.

As an even more accurate way of correcting for wear of the cutting edge of the saw blade, the position of a point on the cutting edge may be determined before and after the formation of a saw-cut, wherein the difference in the position of said point on the cutting edge before and after the formation of a saw-cut is used as feed forward information in controlling the relative movement of the saw-blade and the carrier in the formation of a consecutive saw-cut. The movement of the saw blade and the carrier is hereby corrected for the expected abrasion of the cutting edge by means of extrapolation. It thus possible to use the measured actual depths of the saw-cuts as additional input in the feedback steering of subsequent saw-cuts to be sawed.

The sawn semiconductor product may be subjected to a control measurement wherein the positions of the saw-cuts are registered. In the registration of the position of the saw-cuts, at least one of a saw-cut depth, measured at a right angle to the free surface of the semiconductor product, and a saw-cut offset, measured in a plane of the free surface of the semiconductor product, may be determined. The results of such a post-measurement may form input for future sawing operations. Systematic errors in the position of the saw-cuts and therefore the position of the point on the free surface of the semiconductor product relative to the point on the cutting edge of the saw blade can herewith be detected and corrected for.

BRIEF DESCRIPTION OF THE DRAWINGS

The present invention will be further elucidated on the basis of the non-limitative exemplary embodiments, shown in the following figures, wherein.

DESCRIPTION OF THE INVENTION

Figure 1:
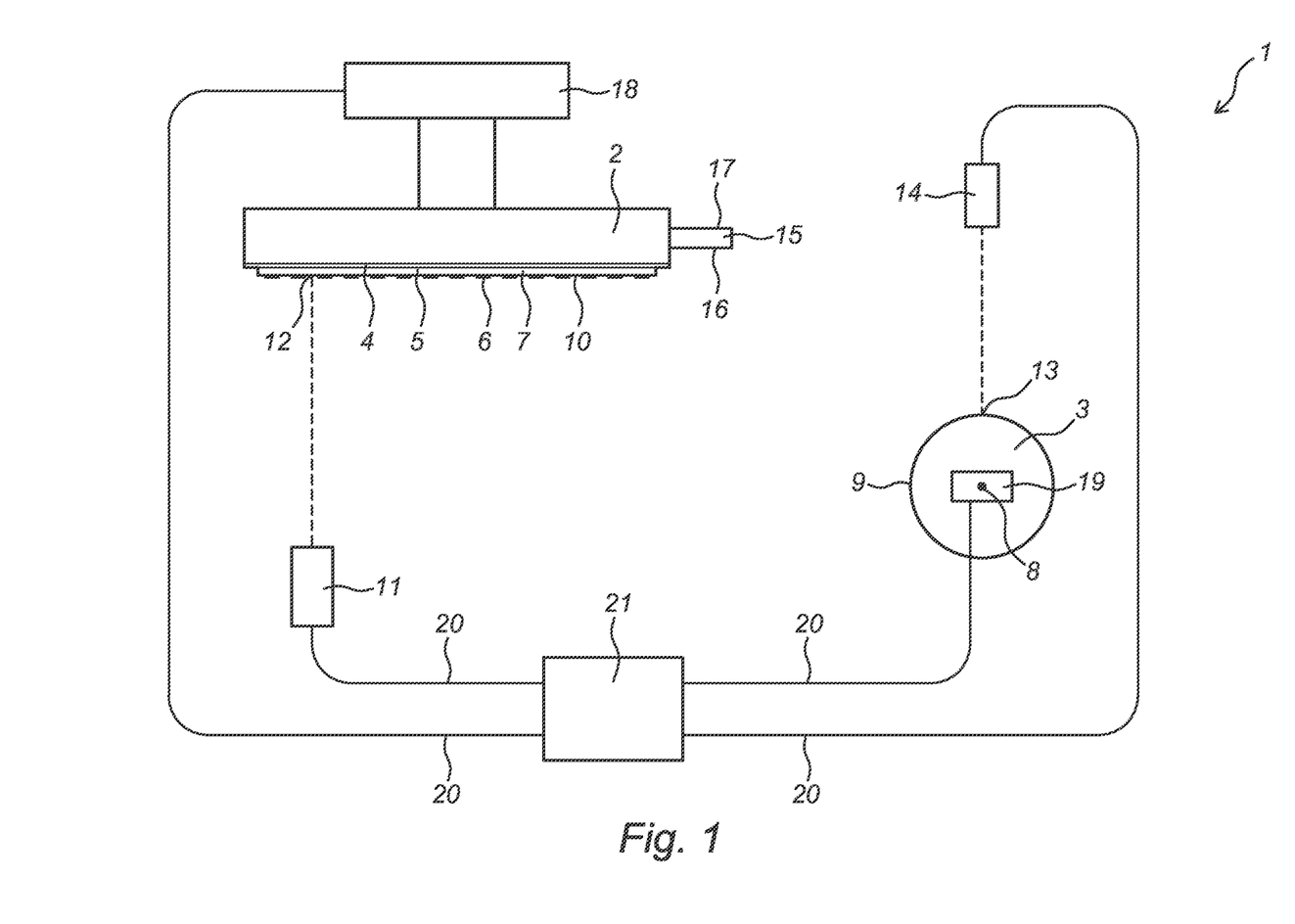
FIG. 1 shows a schematic representation of an embodiment of the sawing device according to the invention.

In the schematic representation of FIG. 1, a sawing device 1 is shown, comprising a carrier 2, otherwise denoted as a chuck or jig, and a saw blade 3. The carrier 2 comprises a holding surface 4 for holding a semiconductor product 5. The holding surface 4 may for example be provided with suction means or clamping means for keeping the semiconductor product 5 stationary with respect to the carrier 2. The semiconductor product 5 may be formed by a number of electrical components 6 (dies) mounted on a wafer, a lead frame, a board or any other form of carrier 7. The saw blade 3 in the present example is of the rotary type and rotatable around a suspension axis 8. The outer periphery of the saw blade 3 is formed by the cutting edge 9 which contacts and therewith cuts into the semiconductor product 5 during the cutting operation. The carrier 2 and the saw blade 3 are moveable relative to each other. Commonly, the sawing device 1 is configured such that the carrier 2 is held in a stationary position during the sawing operation in which the saw blade 3 moves along the semiconductor product 5.

A free surface 10 of the semiconductor product 5, facing away from the carrier 2, is observed by a first position sensor 11. In this particular instance, the first position sensor 11 is formed by a distance sensor, capable of determining the distance between itself and a point 12 on the free surface 10 of the semiconductor product 5, thereby essentially determining the position of said point 12 on the free surface 10 in the in a single dimension. The cutting edge 9 of the saw blade 3, and in particular a point 13 on the cutting edge 9 facing (in this case) upwards towards the free surface 10 of the semiconductor product 5, is observed by a second position sensor 14. Like the first position sensor 11, the second position sensor 14 is formed by a distance sensor, capable of determining the distance between itself and a point 13 on the cutting edge 9 of the saw blade 3.

The carrier 2 is provided with a reference 15, in this embodiment in the form of a reference element protruding past the holding surface 4 of the carrier 2. More in particular, the reference 15 is in this instance formed by a plate-like element with a known thickness. The reference element comprises two reference surfaces: a first reference surface 16 observable by the first position sensor and a second reference surface 17 observable by the second position sensor. The reference 15, and in particular the reference surfaces 16, 17 of the reference element are detectable by the positions sensors 11, 14 through relatively moving the reference 15 and the position sensors 11, 14.

The position sensors 11, 14 and the drives 18, 19 responsible for relatively moving the carrier 2 and the saw blade 3 are (via data links 20) connected to a control unit 21. Data originating from the position sensors 11, 14 is via the connections 20 with the control unit 21 sent to said control unit 21 to process said data into a position of the free surface 10 of the semiconductor product 5 relative to the cutting edge 9 of the saw blade 3. The control unit 21 is further configured to control the drives 18, 19 responsible for relatively moving the carrier 2 and the saw blade 3 and thereby controlling the relative movement of the saw blade 3 and the carrier 2 based on said information on the position of the free surface 10 of the semiconductor product 5 relative to the cutting edge 9 of the saw blade 3. The control unit 21 may be formed by any type of suitable processing means and may comprise multiple modules that may be placed in physically separated locations.

Figure 2:
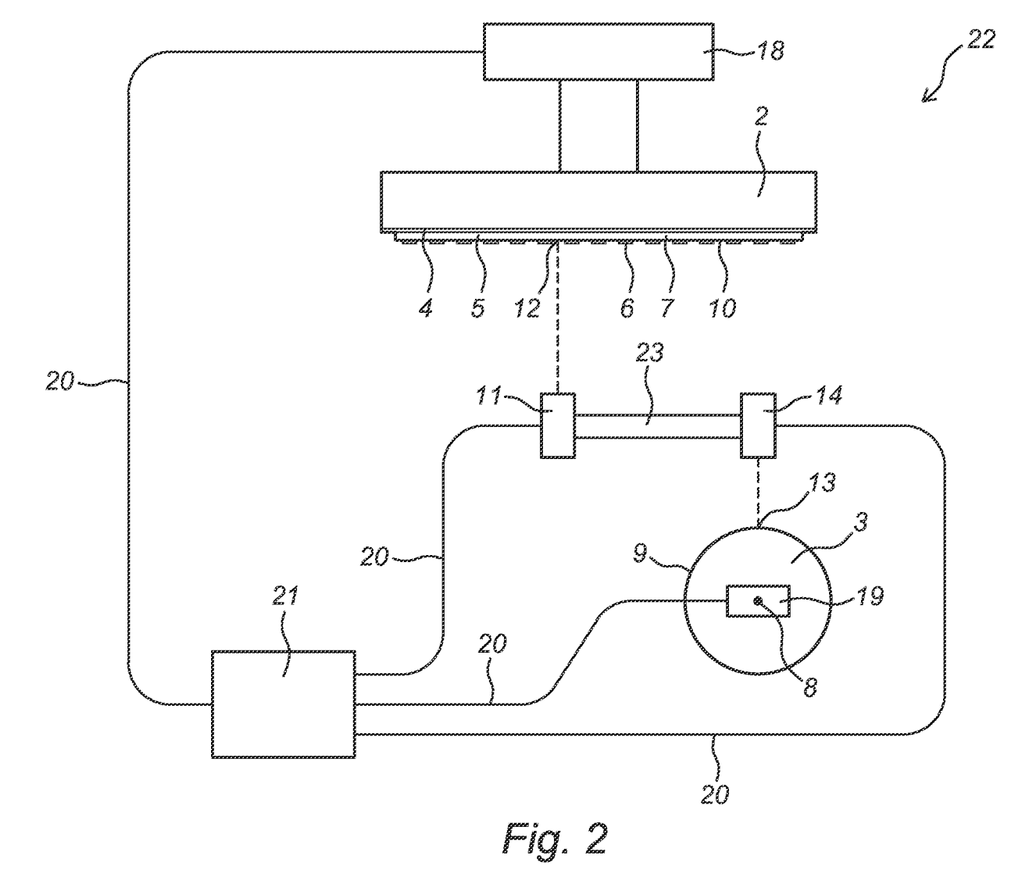
FIG. 2 shows a schematic representation of another embodiment of the sawing device according to the invention.

The sawing device 22 shown in the schematic representation of FIG. 2 only differs from the embodiment of the sawing device 1 shown in FIG. 1 in respect of the implementation of the reference 15, 23. In this instance, an additional reference 23 is formed by a frame that connects the first position sensor 11 to the second position sensor 14. Additional information of the distance spanned by the frame between the first position sensor 11 and the second position sensor 14 is hereby used to further enhance the accuracy of the forming of saw-cuts into a semiconductor product 5.

The invention claimed is:

1. A sawing device for forming saw-cuts into a semiconductor product, comprising:

a carrier comprising a holding surface for holding the semiconductor product, a saw blade comprising a cutting edge, moveable relative to the carrier, a first position sensor for determining the position of a point on a free surface of the semiconductor product held by the carrier relative to said first position sensor, a second position sensor for determining the position of a point on the cutting edge of the saw blade relative to said second position sensor, and a control unit linked to the first position sensor and the second position sensor, which control unit is configured for controlling the relative movement of the saw blade and the carrier, wherein the sawing device further comprises a reference for linking the position of the first position sensor to the position of the second position sensor, wherein the control unit is configured to:

process, with aid of the reference, the positions determined by the first position sensor and the second position sensor into a position of the point on the free surface of the semiconductor product relative to the point on the cutting edge of the saw blade, and control the relative movement of the saw blade and the carrier based on said position of the point on the free surface of the semiconductor product relative to the point on the cutting edge of the saw blade, and wherein the reference is formed by at least one reference surface on the carrier observable by the first position sensor and/or the second position sensor, wherein the first position sensor and the second position sensor are configured for determining the position of a point on at least one of the at least one reference surface.

2. The sawing device according to claim 1, wherein the carrier comprises a reference element protruding past the holding surface, which reference element comprises the at least one reference surface.

3. The sawing device according to claim 1, wherein the reference comprises a first reference surface observable by the first position sensor and a second reference surface observable by the second position sensor, wherein the first position sensor is configured for determining the position of a point on the first reference surface of the reference and the second position sensor is configured for determining the position of a point on the second reference surface of the reference.

4. The sawing device according to claim 1, wherein an additional reference is formed by a frame connecting the first position sensor to the second position sensor, wherein the distance spanned by the frame between the first position sensor and the second position sensor is known and fixed.

5. The sawing device according to claim 1, wherein the first position sensor and the carrier are moveable relative to each other.

6. The sawing device according to claim 1, wherein the second position sensor and the saw blade are moveable relative to each other.

7. The sawing device according to claim 1, wherein the first position sensor is configured for determining the position of a plurality of points on the free surface of the semiconductor product.

8. The sawing device according to claim 7, wherein the control unit is configured to process the position of the plurality of points on the free surface of the semiconductor product into a height profile of said free surface, wherein the control unit is adapted to compensate for said height profile in the control of the relative movement of the saw blade and the carrier.

9. The sawing device according to claim 1, wherein the second position sensor is configured for determining the position of a plurality of points on the cutting edge of the saw blade.

10. The sawing device according to claim 1, wherein at least one of the first position sensor and second position sensor is a distance sensor, in particular a confocal sensor.

11. A method for forming saw-cuts into a semiconductor product, comprising the steps of:

gripping a semiconductor product with a carrier, determining with a first position sensor the position of a point on a free surface of the semiconductor product, determining with a second position sensor the position of a point on a cutting edge of a saw blade, using a reference to link the position of the first position sensor to the position of the second position sensor, processing, with aid of the reference, the positions determined by the first position sensor and the second position sensor into a position of the point on the free surface of the semiconductor product relative to the point on the cutting edge of the saw blade, and moving the saw-blade relative to the carrier based on the position of the cutting edge of the saw blade relative to the bottom surface of the semiconductor product, thereby cutting into the free surface of the semiconductor product, wherein the reference to link the position of the first position sensor to the position of the second position sensor is determined by at least one reference surface on the carrier that is observed by the first position sensor and/or the second position sensor, and wherein the first position sensor and the second position sensor are determining the position of a point in relation to the at least one reference surface.

12. The method according to claim 11, the position of the reference is determined by the first position sensor and the second position sensor.

13. The method according to claim 11, wherein the position of a plurality of points on the free surface of the semiconductor product is determined by the first position sensor.

14. The method according to claim 13, wherein the plurality of points on the free surface of the semiconductor product are processed into a height profile of said free surface, for which height profile is compensated for in the movement the saw-blade relative to the carrier.

15. The method according to claim 14, wherein the height profile of the free surface of the semiconductor product is followed by the cutting edge of the saw blade in a continuous fashion.

16. The method according to claim 11, wherein the position of a point on the cutting edge of the saw blade is determined before and after the formation of a saw-cut, wherein the difference in the position of said point on the cutting edge before and after the formation of a saw-cut is used as feed forward information in controlling the relative movement of the saw-blade and the carrier in the formation of a consecutive saw-cut.

17. The method according to claim 11, wherein the sawn semiconductor product is subjected to a control measurement wherein the positions of the saw-cuts are registered.

18. The method according to claim 17, wherein in the registration of the position of the saw-cuts, at least one of a saw-cut depth, measured at a right angle to the free surface of the semiconductor product, and a saw-cut offset, measured in a plane of the free surface of the semiconductor product, is determined.

\* \* \* \* \*

UNITED STATES PATENT AND TRADEMARK OFFICE
CERTIFICATE OF CORRECTION

| | | |
|---|---|---|
| PATENT NO. | : 11,935,764 B2 | |
| APPLICATION NO. | : 17/415944 | |
| DATED | : March 19, 2024 | |
| INVENTOR(S) | : Mark Hermans | |

It is certified that error appears in the above-identified patent and that said Letters Patent is hereby corrected as shown below:

In the Claims

Column 10, Line 38, Claim 12, delete "the" and insert -- wherein the --.

Signed and Sealed this
Fourteenth Day of May, 2024

*Katherine Kelly Vidal*

Katherine Kelly Vidal
*Director of the United States Patent and Trademark Office*